United States Patent
Asano et al.

(10) Patent No.: US 7,139,215 B2
(45) Date of Patent: Nov. 21, 2006

(54) APPARATUS AND METHOD OF WORD LINE DECODING FOR DEEP PIPELINED MEMORY

(75) Inventors: Toru Asano, Omihachiman (JP); Sang Hoo Dhong, Austin, TX (US); Takaaki Nakazato, Austin, TX (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 10/982,109

(22) Filed: Nov. 5, 2004

(65) Prior Publication Data

US 2006/0098520 A1 May 11, 2006

(51) Int. Cl.
*G11C 8/00* (2006.01)
(52) U.S. Cl. .......................... 365/230.06; 365/230.08; 365/233; 365/185.23
(58) Field of Classification Search ........... 365/230.06, 365/230.08, 233, 185.23
See application file for complete search history.

(56) References Cited

U.S. PATENT DOCUMENTS

| | | | | |
|---|---|---|---|---|
| 5,544,342 A | * | 8/1996 | Dean | 711/119 |
| 5,604,712 A | * | 2/1997 | Priebe | 365/230.06 |
| 5,808,959 A | * | 9/1998 | Kengeri et al. | 365/233 |
| 5,812,482 A | * | 9/1998 | Jiang et al. | 365/230.06 |
| 6,331,793 B1 | * | 12/2001 | Fletcher et al. | 327/51 |
| 6,665,231 B1 | * | 12/2003 | Mizuno et al. | 365/233 |
| 6,914,849 B1 | * | 7/2005 | Cao et al. | 365/230.06 |
| 2002/0000822 A1 | * | 1/2002 | Tomishima | 324/763 |
| 2005/0254585 A1 | * | 11/2005 | Adams et al. | 375/242 |

* cited by examiner

*Primary Examiner*—Richard Elms
*Assistant Examiner*—Eric J. Wendler
(74) *Attorney, Agent, or Firm*—Carr LLP; Diana R. Gerhardt

(57) ABSTRACT

A method, an apparatus, and a computer program are provided to reduce the number of required latches in a deep pipeline wordline (WL) decoder. Traditionally, a signal local clock buffer (LCB) has been responsible for providing a driving signal to a WL driver. However, with this configuration, a large number of latches are utilized. To reduce this latch usage, a number of LCBs are employed, such that one latch can enable an increased number of WLs. Hence, the overall area occupied by latches is reduced and power consumption is reduced.

19 Claims, 3 Drawing Sheets

APPARATUS AND METHOD OF WORD LINE DECODING FOR DEEP PIPELINED MEMORY

FIELD OF THE INVENTION

The present invention relates generally to memory arrays, and more particularly, to wordline decoding for memory arrays.

DESCRIPTION OF THE RELATED ART

In conventional memory arrays, the pipeline is becoming increasingly deep. Additionally, the performance of memory arrays is becoming increasingly important to assist in high speed computations and computer performance. However, in deep pipelined high performance memory, a wordline driver has a cycle bound that starts the access cycle. To utilize a cycle bound to initiate the access cycle, wordline drivers typically employ latches. Each latch employed then consumes power.

Referring to FIG. 1 of the drawings, the reference numeral 100 generally designates conventional memory. The memory 100 comprises a predecoder 102, a final decoder 104, 64 wordline (WL) drivers 106, a local clock buffer (LCB) 108, and a 64 wordline array 114.

To begin the access cycle for the memory 100, an address is first received at the predecoder 102 through a first communication channel 116. Typically, the address is 6 bits long, and from those 6 bits, the predecoder derives two distinct wordline select signals, an X wordline select signal and a Y wordline select signal. The X wordline select signal is 8 bits long and is output to the final decoder 104 through a second communication channel 118. The Y wordline select signal is output to the final decoder 104 through a third communication channel 120 and is 8 bits long.

Once the X wordline select signal and the Y wordline select signal have been transmitted to the final decoder 104, the final decoder 104 determines which of the 64 wordline drivers 106 are to be enabled. The wordline enable signals are communicated to the wordline drivers 106 through a fourth communication channel 122. The LCB 108 provides a clocking signal to the wordline drivers 106 through a fifth communication channel 128. The clocking signal from the LCB 108 is usually based on two inputs, a clock input and an enable input, which are provided to the LCB 108 through a sixth communication channel 124 and a seventh communication channel 126, respectively.

Each of the wordlines within the array 114 has an associated driver. Each driver comprises a latch and an AND gate, so that for the 64 wordline array 114, there are 64 drivers. For the sake of illustration, a single latch 110 and an AND gate 112 are depicted. To function, the latch 110 receives a wordline enable signal through the fourth communication channel 122, where the signal is latched. The latch 110 then outputs a signal to the AND gate 112 through an eighth communication channel 130. The AND gate 112 also received the clocking signal from the LCB 108 through the fifth communication channel 128. The AND gate 112 then outputs a wordline signal to a wordline within the 64 wordline array 114 through a ninth communication channel 132.

These conventional memories, such as the memory 100, can, however, have several drawbacks. For example, clock load for the wordline timing signal can be high. Because of the large number of latches, there is a substantial risk of soft errors, and more latches require more clock power. Therefore, there is a need for a method and/or apparatus for storing data that addresses at least some of the problems associated with conventional memories.

SUMMARY OF THE INVENTION

The present invention provides a wordline (WL) driver method, apparatus, and computer program for reducing required latches in a WL decode path for deep pipelined memory and for use in a WL decode scheme. As with many systems, a plurality of timing signals are generated. A WL driver then receives a WL enable data signal. Once received, a plurality of WL signals are generated based on the plurality of timing signals and the WL enable data signal.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
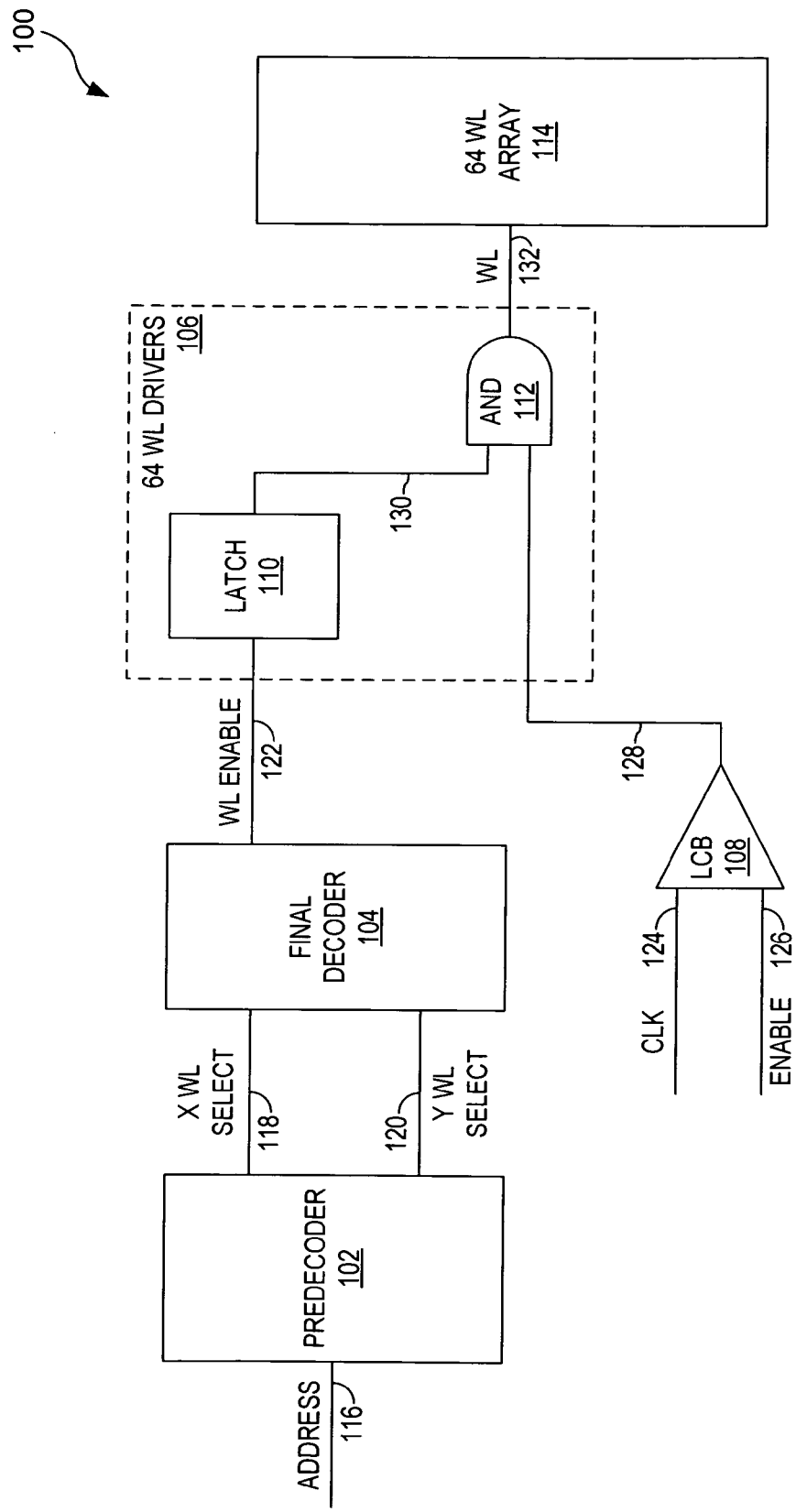
FIG. 1 is a block diagram depicting conventional memory.
Figure 2:
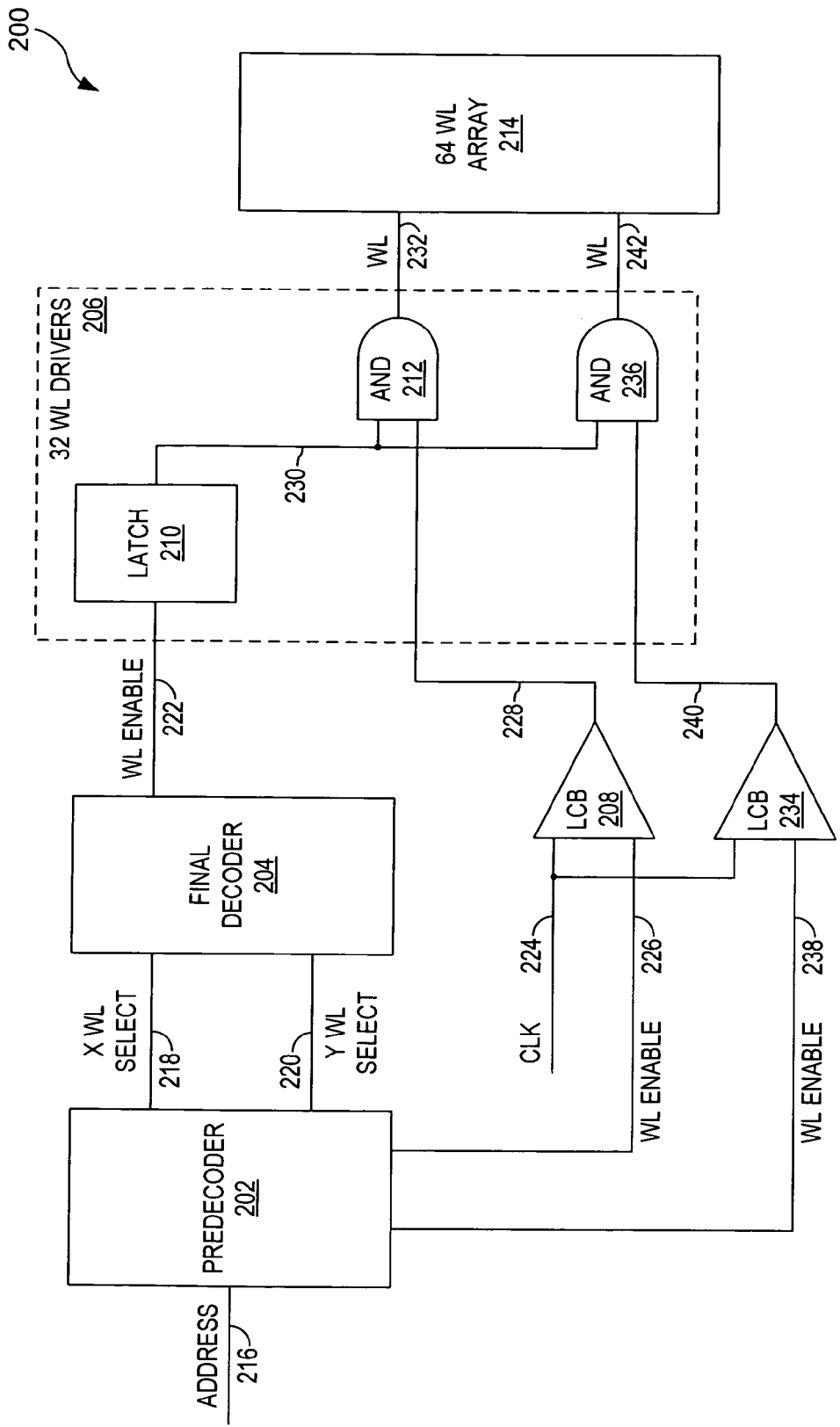
FIG. 2 is a block diagram depicting modified memory.
Figure 3:
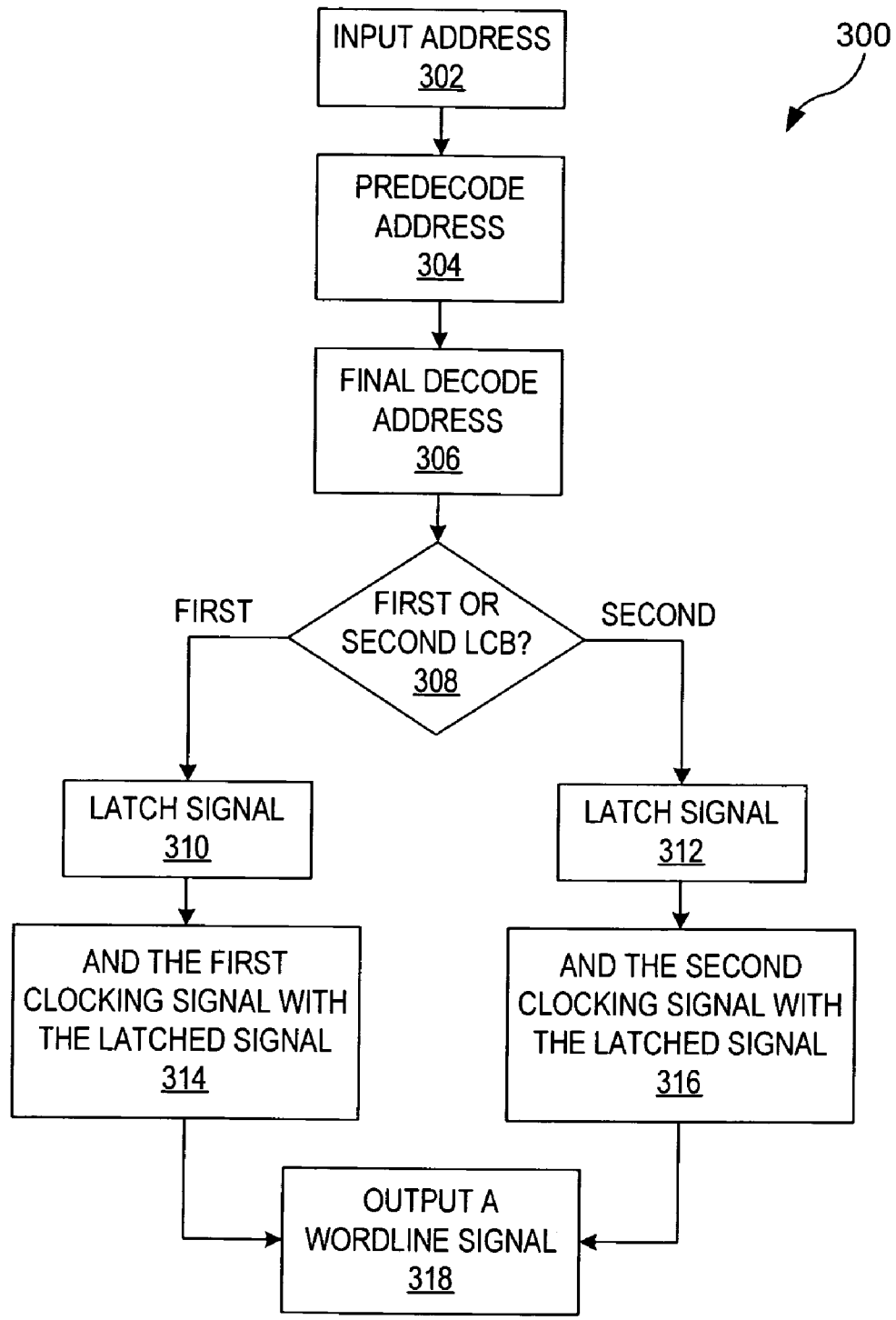
FIG. 3 is a flow chart depicting the operation of the modified memory.

Referring to FIGS. 2 and 3 of the drawings, the reference numerals 200 and 300 generally designate modified memory and the operation of the modified memory. The memory 200 comprises a predecoder 202, a final decoder 204, 32 wordline drivers 206 a first LCB 208, a second LCB 234, and a 64 wordline array 214.

To begin the access cycle for the memory 200, an address is first received in step 302 at the predecoder 202 through a first communication channel 216. Typically, the address is 6 bits long, and from those 6 bits, the predecoder derives a wordline enable signal and two wordline select signals in step 304, an X wordline select signal and a Y wordline select signal. The X wordline select signal is 8 bits long and is output to the final decoder 204 through a second communication channel 218. The Y wordline select signal is output to the final decoder 204 through a third communication channel 220 and is 4 bits long.

Once the X wordline select signal and the Y wordline select signal have been transmitted to the final decoder 204, the final decoder 204 in step 306 determines which of the 32 wordline drivers 206 are to be enabled. The "true final decode," though, is done at wordline drivers 206 by enabling and selectively activating clock signals. The wordline enable signals are communicated to the wordline drivers 206 through a fourth communication channel 222. The first LCB 208 and the second LCB 234 also provide clocking signals to the wordline drivers 206 through a fifth communication channel 228 and a sixth communication channel 240.

The clocking signal from each of the LCBs 208 and 234 are based on two inputs, a clock input and a select signal. Each of the LCBs 208 and 234 receive a clocking signal through a seventh communication channel 224, and the predecoder 202 generates additional selection signals for the LCBs 208 and 234 in step 308. A selection signal for the first LCB 208 and for the second LCB 234 are provided by the predecoder 202 through an eighth communication channel 226 and a ninth communication channel 238, respectively. By providing selection signals to the LCBs, the last decoding can be delayed until the wordline driver stage. Also, AND gates can be replaced by NAND gates, NOR gates, or OR gates depending upon the circuit type which receives the wordlines.

The significance of the late last decoding to the wordline driver stage is that the number of latches can be reduced. Within the modified memory 200, every two of the wordlines within the array 214 has an associated driver. Each driver comprises a latch and two AND gates, so that for the 64 wordline array 214, there are 32 drivers. For the sake of illustration, a single latch 210, first AND gate 212, and a second AND gate 236 are depicted. To function, the latch 210 receives a wordline enable signal through the fourth communication channel 222, where the signal is latched in step 310 and 312. The latch 210 then outputs a signal to the first AND gate 212 and the second AND gate 236 through a tenth communication channel 230. The first AND gate 212 receives a clocking signal from the first LCB 208 through the fifth communication channel 228, while the second AND gate 236 receives a clocking signal from the second LCB 234 through the sixth communication channel 240. Depending on the most significant bit of the address signal that is input into the predecoder 202, either the first AND gate 212 or the second AND gate 236 is selected, wherein the clocking signal is ANDed with the output of the latch 210 in steps 314 and 316. One of the respective AND gates 212 and 236 can then output a wordline signal in step 318 to a wordline within the 64 wordline array 214 through an eleventh communication channel 232 or a twelfth communication channel 242, respectively.

By having the late last decoding, area and power consumption can be reduced. Because each of the LCBs only provide one-half the power, the drive ability of the LCBs are reduced. The impact, though, of the reduction of drive ability is negated by the fact that the number of LCBs is doubled. However, the area of the final decoder can be reduced by one-half and the number of latches can be reduced by one-half. The reduction of the number of latches, therefore, reduces power consumption and area. And, it also lowers the risk of soft errors.

Additionally, for the purposes of illustration, 1 bit has been utilized for LCB selections. It is possible to have 2 or more LCB selections up to N bits. In each case, there will be $2^N$ LCBs each with a reduced load of $2^{-N}$. Also, the number of latches can be reduced $2^{-N}$, and the area of the final decoder can be reduced by $2^{-N}$.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A wordline (WL) driver method for a deep pipelined memory array comprising a plurality of wordlines and for use in a WL decode scheme, comprising:
    predecoding a received WL address associated with a memory array WL to generate a WL select signal and a second WL select signal;
    generating an enable signal for one of a plurality of local clock buffers (LCBs) based on the received WL address;
    generating a clock signal based on the enable signal;
    generating a WL enable signal based on the first WL select signal and the second WL select signal; and
    generating a WL signal for the memory array WL associated with the received WL address based on the clock signal and the WL enable signal.

2. The method as recited in claim 1, wherein the plurality of LCBs comprises two LCBs.

3. The method as recited in claim 1, wherein only one of the plurality of LCBs is enabled based on the enable signal.

4. The method as recited in claim 1, wherein the first WL select signal is an X WL select signal.

5. The method as recited in claim 4, wherein the X WL select signal comprises eight bits.

6. The method as recited in claim 1, wherein the second WL select signal is a Y WL select signal.

7. The method as recited in claim 6, wherein the Y WL select signal comprises four bits.

8. The method as recited in claim 1, wherein the WL address comprises six bits.

9. A system, comprising:
    a predecoder configured to receive a wordline (WL) address associated with a deep pipelined memory WL, and to generate a first WL select signal, a second WL select signal, and a local clock buffer (LCB) enable signal based on the received WL address;
    a plurality of LCBs coupled to the predecoder and configured to transmit a clock signal based on a received LCB enable signal;
    a final decoder coupled to the predecoder and configured to generate a WL enable signal in response to a received first WL select signal and a received second WL select signal; and a plurality of WL drivers coupled to the final decoder and to the plurality of LCBs and configured to receive the WL enable signal and the clock signal, and to generate a WL signal for the memory WL associated with the received WL address based on the WL enable signal and the clock signal.

10. The system of claim 9, wherein the plurality of LCBs comprises two LCBs.

11. The system of claim 9, wherein only one of the plurality of LCBs is enabled in response to the received WL address.

12. The system of claim 9, wherein the first WL select signal is an X WL select signal.

13. The system of claim 12, wherein the X WL select signal comprises eight bits.

14. The system of claim 9, wherein the second WL select signal is a Y WL select signal.

15. The system of claim 14, wherein the Y WL select signal comprises four bits.

16. The system of claim 9, wherein the WL address comprises six bits.

17. The system of claim 9, wherein the plurality of WL drivers each comprise:
   a latch configured to receive the WL enable signal;
   a first AND gate coupled to the latch and configured to receive a clock signal from a first of the plurality of LCBs; and
   a second AND gate coupled to the latch and configured to receive a clock signal from a second of the plurality of LCBs.

18. A method for driving a deep pipelined memory array wordline, comprising:
   receiving an input address associated with a wordline of a deep pipelined memory array comprising a plurality of wordlines;
   predecoding the input address to generate a plurality of select signals;
   enabling either a first local clock buffer (LCB) or a second LCB in response to predecoding the input address, to generate a first clock signal or a second clock signal;
   decoding the plurality of select signals to select from among the plurality of deep pipelined memory array wordlines;
   generating a wordline enable signal in response to decoding the plurality of select signals;
   latching, by a wordline driver, the wordline enable signal;
   performing a logical AND operation on the wordline enable signal and the first or second clock signal to generate a wordline signal; and
   driving a deep pipelined memory array wordline in response to the wordline signal.

19. The method of claim 18, wherein:
   the input address comprises six bits; and
   the plurality of select signals comprise an eight-bit X wordline select signal and a four-bit Y wordline select signal.

* * * * *